(12) United States Patent
Niimi et al.

(10) Patent No.: US 10,611,932 B2
(45) Date of Patent: Apr. 7, 2020

(54) TRANSPARENT ADHESIVE SHEET

(71) Applicant: Mitsubishi Chemical Corporation, Tokyo (JP)

(72) Inventors: Kahoru Niimi, Nagahama (JP); Makoto Inenaga, Nagahama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 266 days.

(21) Appl. No.: 15/324,006

(22) PCT Filed: Aug. 12, 2015

(86) PCT No.: PCT/JP2015/072865
§ 371 (c)(1),
(2) Date: Jan. 5, 2017

(87) PCT Pub. No.: WO2016/024618
PCT Pub. Date: Feb. 18, 2016

(65) Prior Publication Data
US 2017/0198175 A1    Jul. 13, 2017

(30) Foreign Application Priority Data

Aug. 12, 2014 (JP) ................................ 2014-164152

(51) Int. Cl.
| C09J 11/06 | (2006.01) |
|---|---|
| C09J 155/00 | (2006.01) |
| C09J 7/10 | (2018.01) |
| C08F 290/04 | (2006.01) |
| C09J 133/12 | (2006.01) |
| C09J 201/00 | (2006.01) |
| C09J 5/06 | (2006.01) |
| C09J 133/08 | (2006.01) |
| C09J 151/00 | (2006.01) |
| H01L 33/50 | (2010.01) |
| C08K 5/00 | (2006.01) |
| C08K 5/45 | (2006.01) |
| G02B 5/20 | (2006.01) |

(52) U.S. Cl.
CPC ............. *C09J 11/06* (2013.01); *C08F 290/04* (2013.01); *C08F 290/046* (2013.01); *C09J 5/06* (2013.01); *C09J 7/10* (2018.01); *C09J 133/08* (2013.01); *C09J 133/12* (2013.01); *C09J 151/003* (2013.01); *C09J 155/005* (2013.01); *C09J 201/00* (2013.01); *H01L 33/502* (2013.01); *C08K 5/0041* (2013.01); *C08K 5/45* (2013.01); *C09J 2205/102* (2013.01); *C09J 2205/114* (2013.01); *C09J 2205/31* (2013.01); *C09J 2433/00* (2013.01); *C09J 2451/00* (2013.01); *G02B 5/208* (2013.01)

(58) Field of Classification Search
CPC .... C09J 201/00; C09J 2451/00; C09J 129/00; C09J 155/005; C09J 7/10; C09J 7/12; C09J 5/06; C09J 11/06; C09J 133/12; C08F 290/046; C08F 290/04
See application file for complete search history.

(56) References Cited

U.S. PATENT DOCUMENTS

| 8,715,448 | B2 | 5/2014 | Niimi et al. |
|---|---|---|---|
| 9,481,154 | B2 | 11/2016 | Niimi et al. |
| 9,481,155 | B2 | 11/2016 | Niimi et al. |
| 9,663,688 | B2 * | 5/2017 | Motohashi ............. C09J 163/00 |
| 2014/0320770 | A1 | 10/2014 | Motohashi et al. |
| 2014/0356591 | A1 | 12/2014 | Motohashi et al. |
| 2015/0041042 | A1 * | 2/2015 | Zhang ........................ C09J 7/22 156/60 |
| 2015/0044479 | A1 | 2/2015 | Motohashi et al. |

FOREIGN PATENT DOCUMENTS

| JP | 4971529 B2 | 7/2012 |
|---|---|---|
| JP | 2013-166846 A | 8/2013 |
| JP | 2013-184997 A | 9/2013 |
| WO | 2010/027041 A1 | 3/2010 |
| WO | 2010/038366 A1 | 4/2010 |
| WO | 2013/105163 A1 | 7/2013 |
| WO | WO-2013140472 A1 * | 9/2013 ............ C09J 163/00 |

OTHER PUBLICATIONS

International Search Report dated Nov. 10, 2015 in PCT/JP2015/072865 filed Aug. 12, 2015.

* cited by examiner

*Primary Examiner* — Sanza L. McClendon
(74) *Attorney, Agent, or Firm* — Oblon, McClelland, Maier & Neustadt, L.L.P.

(57) ABSTRACT

A photocurable adhesive sheet that can be photocured even if there are places such as print-concealed sections that are difficult for light to reach, and even if the adhesive sheet has a certain degree of thickness, the entire sheet can be cured. A transparent adhesive sheet formed from an adhesive composition containing: (A) a thermoplastic resin; (B) a crosslinking agent; (C) a photopolymerization initiator that reacts with light having a wavelength of at least 380 to 430 nm; and (D) a wavelength conversion agent that is excited by light having a wavelength shorter than 380 nm and that emits light having a wavelength of 380 to 550 nm. The transparent adhesive sheet is characterized by the adhesive sheet absorbance X at a wavelength of 390 nm and the adhesive sheet thickness Y satisfying relational formula (1):

$0.5 \leq X/Y \leq 12$.    Formula (1):

11 Claims, No Drawings

TRANSPARENT ADHESIVE SHEET

TECHNICAL FIELD

The present invention relates to a photocurable transparent adhesive sheet that is suitable for bonding image display device constituent members.

BACKGROUND ART

In recent years, in order to enhance visibility of image display devices, a gap between an image display panel such as a liquid crystal display (LCD), a plasma display (PDP), an electroluminescence display (ELD) and a protective panel or a touch panel member disposed on the front side (viewing side) thereof has been filled with a bond to suppress reflection of incident light or light emitting from the display image at an air layer interface.

As such method for filling the gap between the image display device constituent members with an adhesive, a method is known in which a liquid adhesive resin composition containing a UV-curable resin is filled in the gap and then cured by irradiating with UV light (Patent Document 1).

In addition, a method to fill the gap between the image display device constituent members with an adhesive sheet is also known. For example, Patent Document 2 discloses a method including bonding a primary crosslinked adhesive sheet by UV light to the image display device constituent members, and thereafter irradiating the adhesive sheet by UV light via the image display device constituent members for secondary curing.

Patent Document 3 discloses a method to fill the gap between the image display device constituent members with an adhesive sheet formed from a hot-melt type adhesive composition which contains urethane (meth)acrylate having a weight average molecular weight of 20,000 to 100,000 as a main component and in which the loss tangent at 25° C. is less than 1.

Incidentally, in the image display devices such as mobile phones, mobile terminals, and the like, a concealed section is generally printed in a frame shape at the periphery of a surface protection panel. In the case of bonding the image display device constituent members with the photocurable adhesive or the adhesive sheet as described above, when the concealed section is present, there is a problem that it is difficult to obtain a stable quality since there are places where UV light irradiated to cure the adhesive hardly reaches and thus such places could not be cured.

Hence, for instance, Patent Document 4 (Japanese Patent Laid-Open No. 2013-184997) discloses a liquid photocurable resin composition containing an ethylenically unsaturated bond-containing component, a photopolymerization initiator having a maximum absorption wavelength in the range of 370 to 420 nm, and a phosphor, as the liquid photocurable resin composition which can be well cured even at the shadow part, the narrow gap part, or the like.

CITATION LIST

Patent Document

Patent Document 1: International Publication No. WO 2010/027041
Patent Document 2: Japanese Patent No. 4971529
Patent Document 3: International Publication No. WO 2010/038366
Patent Document 4: Japanese Patent Laid-Open No. 2013-184997

SUMMARY OF THE INVENTION

Problem to be Solved by the Invention

When the image display device constituent members are bonded with the liquid UV-curable adhesive as described in the Patent Document 4, there is a problem that the productivity is decreased since unevenness in thickness may easily occur at applying or filling the liquid and works related to the adjusting or the setting conditions becomes complicated. Also, when the phosphor is mixed, transparency of the adhesive resin composition is decreased, and the thickness of the bond becomes too thick, light does not reach the deep part of the adhesive, thereby there is a problem that the curability is rather decreased. Further, when an insufficient curing of the bond at the place where the thickness is too thick or the shadow part, or the like has occurred, there is also a problem that critical failures such as overflow of the adhesive or corrosion of the contact member may easily occur.

Meanwhile, when an adhesive sheet having a sheet shape in a normal state is used for bonding the image display device constituent members, critical failures such as overflow of the adhesive even in an uncured state do not occur. However, from the viewpoint of that the adhesive is filled to every corner by flexibly following a printed step which forms a concealed section and a distortion occurred in the adhesive sheet is suppressed, the adhesive sheet is required to have flexibility and fluidity.

Thus, the present invention relates to a photocurable adhesive sheet having a sheet shape in a normal state, and is intended to propose a new adhesive sheet that can be photocured even if there are places such as print-concealed sections that are difficult for light to reach, and even if the adhesive sheet has a certain degree of thickness, the entire sheet can be cured.

Means for Solving Problem

The present invention proposes a transparent adhesive sheet formed from an adhesive composition containing: (A) a thermoplastic resin; (B) a crosslinking agent; (C) a photopolymerization initiator that reacts with light having a wavelength of at least 380 to 430 nm; and (D) a wavelength conversion agent that is excited by light having a wavelength shorter than 380 nm and that emits light having a wavelength of 380 to 550 nm, wherein an adhesive sheet absorbance X at a wavelength of 390 nm and an adhesive sheet thickness Y satisfy the following relational formula (1).

$$0.5 \leq X/Y \leq 12 \quad \text{Formula (1):}$$

Effect of the Invention

In the transparent adhesive sheet proposed by the present invention, the wavelength conversion agent (D) is excited by irradiating light having a wavelength shorter than 380 nm, that is, for instance, "UV light", and emits light having a wavelength of 380 to 550 nm, that is, for instance, "visible light". The wavelength conversion agent (D) emits visible light in the inside of the adhesive sheet as described above so that the visible light reaches even if there are places such as print-concealed sections that are difficult for the UV light to reach, thereby the adhesive sheet can be cured by photo-crosslinking with the photopolymerization initiator (C).

Further, the adhesive sheet absorbance X and the thickness Y are adjusted to satisfy the above relational formula (1) so that, even if the adhesive sheet has a certain degree of thickness, the light reaches the deep part of the adhesive sheet and the visible light reaches even if there are places such as print-concealed sections that are difficult for the UV light to reach, thereby the entire sheet can be cured.

MODE(S) FOR CARRYING OUT THE INVENTION

Next, an example of embodiment of the present invention will be described. However, the invention is not limited to the embodiments to be described below.

<Present Adhesive Sheet>

The transparent adhesive sheet according to an example of embodiments of the present invention (hereinafter, referred to as "present adhesive sheet") is a transparent adhesive sheet comprising an adhesive composition (referred to as "present adhesive composition") containing: (A) a thermoplastic resin; (B) a crosslinking agent; (C) a photopolymerization initiator that reacts with light having a wavelength of at least 380 to 430 nm; and (D) a wavelength conversion agent that is excited by light having a wavelength shorter than 380 nm and that emits light having a wavelength of 380 to 550 nm.

It is preferable that the present adhesive sheet can maintain a sheet shape in a normal state, and has a hot-melting property of being melted or flowed by heating in an uncrosslinked state, and photo-crosslinkability of being crosslinked by light.

If the sheet shape can be maintained in a normal state, it is particularly excellent in productivity since the handling thereof is easy compared with a liquid bond, and a work to fill a liquid can be omitted.

In addition, it is further preferable if the sheet has suitable adhesiveness, for instance, adhesiveness with a peelable degree (referred to as "tackiness") since a positioning for bonding can be easily performed and it is very convenient on work.

Also, if the sheet has the hot-melting property of being melted or flowed by heating, the adhesive is softened or flowed by heating so that the adhesive can be filled by following to an unevenness part such as a printed step, thereby it can be filled without occurring bubbles.

Furthermore, if the sheet has the photo-crosslinkability, it can be firmly bonded by photo-crosslinking at the end.

It is particularly preferable that the present adhesive sheet has a hot-melting property of being softened or flowed by heating at 60 to 100° C.

If the sheet has such hot-melting property, it has excellent handleability pertaining to storage stability and cutting in a state of pre-bonding at a normal state since a shape thereof can be maintained at a normal state.

Meanwhile, if the sheet is softened by heating at a high temperature of more than 100° C., there is a possibility that the image display device constituent members are damaged by heating at more than 100° C., thereby the thermal damage of the image display device constituent members can be prevented.

Thus, from the viewpoint of the above, it is preferable that the present adhesive sheet is softened or flowed by heating at 60 to 100° C. More preferably, the present adhesive sheet has a property of being softened or flowed by heating at 63° C. or more or 98° C. or less, and particularly preferably at 65° C. or more or 95° C. or less.

The present adhesive sheet may be a monolayer or a multilayer.

When the present adhesive sheet is the multilayer, it is preferable that the adhesive sheet has the above properties as a whole, in other words, the adhesive sheet can maintain a sheet shape in a normal state, and has a hot-melting property of being melted or flowed by heating in an uncrosslinked state, and photo-crosslinkability of being crosslinked by light.

A thickness of the present adhesive sheet is preferably 50 μm to 1 mm, more preferably 75 μm or more or 500 μm or less.

When the thickness of the present adhesive sheet is 50 μm or more, it is preferable on the point that the sheet can follow to an unevenness part such as a large printed step. Meanwhile, when the sheet thickness is 1 mm or less, the sheet can meet the demand of thinning an optical device or the like.

Furthermore, from the viewpoint of a higher printed height of a concealing layer on the periphery of a conventional image display device, specifically, from the viewpoint of filling even a step of about 80 μm, the thickness of the present adhesive sheet is still more preferably 75 μm or more, particularly further preferably 100 μm or more. Meanwhile, from the viewpoint of meeting the demand of thinning, the total thickness is preferably 500 μm or less, particularly further preferably 350 μm or less.

It is preferable that the present adhesive sheet meets the following conditions (1) and (2) in a pre-crosslinked state:

(1) for a sheet with the thickness of 150 μm comprising the pre-crosslinked transparent adhesive material, a shifted length at a temperature of 40° C. with respect to a SUS plate is less than 5 mm in holding force measurement according to JIS-Z-0237; and (2) for the sheet with the thickness of 150 μm comprising the pre-crosslinked transparent adhesive material, a shifted length at a temperature of 80° C. with respect to a SUS plate is 10 mm or more in holding force measurement according to JIS-Z-0237.

As described in (1), when the shifted length at the temperature of 40° C. is less than 5 mm in the pre-crosslinked state, excellent shape stability and processing suitability can be exhibited in a normal state before the heating.

Further, as described in (2), when the shifted length at the temperature of 80° C. is 10 mm or more in the pre-crosslinked state, in a laminate with not only a comparatively small size of, for instance, 2 to 4 inches, but also a comparatively large size of, for instance, 7 inches or more, a bonded member can be easily separated by heating at 60 to 100° C.

It is preferable that the present adhesive sheet meets the following conditions (3) and (4) in a pre-crosslinked state:

(3) a 1800 peel force is 5 N/cm or more when the sheet with the thickness of 150 μm comprising the pre-crosslinked transparent adhesive material is superposed on a soda lime glass, and the two were roll-crimped by reciprocating a roller of 2 kg one time, and then the adhesive sheet is peeled off from the soda lime glass at a temperature of 23° C., a peel angle of 1800, and a peel rate of 60 mm/min; and (4) a 1800 peel force is less than 2 N/cm when the sheet with the thickness of 150 μm comprising the pre-crosslinked transparent adhesive material is superposed on a soda lime glass, and the two were roll-crimped by reciprocating a roller of 2 kg one time, and then the adhesive sheet is peeled off from the soda lime glass at a temperature of 85° C., a peel angle of 1800, and a peel rate of 60 mm/min.

As described in (3), when the 1800 peel force at the temperature of 23° C. is 5 N/cm or more in the pre-crosslinked state, adhesiveness with a peelable degree (referred to as "tackiness") can be exerted, and by having such tackiness, a positioning for bonding can be easily performed, and thus it is very convenient on work.

Further, as described in (4), when the 1800 peel force at the temperature of 85° C. is less than 2 N/cm in the pre-crosslinked state, for the members after being bonded, excellent repeelability at heating can be imparted.

It is preferable that the present transparent adhesive material meets the following conditions (5) and (6) in a crosslinked state:

(5) a 1800 peel force is 5 N/cm or more when the sheet with the thickness of 150 μm comprising the pre-crosslinked transparent adhesive material is superposed on a soda lime glass, and the two were roll-crimped by reciprocating a roller of 2 kg one time, and then the adhesive sheet is peeled off from the soda lime glass at a temperature of 23° C., a peel angle of 1800, and a peel rate of 60 mm/min in a state of that the transparent adhesive material is crosslinked by irradiating light such that 2,000 mJ/cm$^2$ of light at 365 nm wavelength reaches the transparent adhesive layer; and (6) a 1800 peel force is 5 N/cm or more when the sheet with the thickness of 150 μm comprising the pre-crosslinked transparent adhesive material is superposed on a soda lime glass, and the two were roll-crimped by reciprocating a roller of 2 kg one time, and then the adhesive sheet is peeled off from the soda lime glass at a temperature of 85° C., a peel angle of 1800, and a peel rate of 60 mm/min in a state of that the transparent adhesive material is crosslinked by irradiating light such that 2,000 mJ/cm$^2$ of light at 365 nm wavelength reaches the transparent adhesive layer.

As described in (5), when the 1800 peel force at the temperature of 23° C. is 5 N/cm or more in the crosslinked state, it is preferable since reliability with respect to a peeling or the like of the bonded laminate in a normal state can be secured.

Further, as described in (6), when the 180° peel force at the temperature of 85° C. is 5 N/cm or more in the crosslinked state, a laminate having excellent durability can be provided.

<Adhesive Composition>

A preferred example of the adhesive composition used for forming the present adhesive sheet, as well as a preferred thermoplastic resin (A) and a crosslinking agent (B) will be described later. Here, a photopolymerization initiator (C) and a wavelength conversion agent (D) will be explained at first.

(Photopolymerization Initiator (C))

The photopolymerization initiator (C) may be any initiator as long as such an initiator generates a radical by irradiation with light having a wavelength of at least 380 to 430 nm and serves as origination of the polymerization reaction of the base resin.

Herein, the "reacts with light having a wavelength of 380 to 430 nm" means that the initiator may react with a light having any wavelength in the range of 380 to 430 nm, and to allow reacting with a light having a wavelength of other region. Conceptually, it is meant that the initiator may react with UV light if it reacts with a light having a wavelength of visible light region.

Incidentally, reactive radical generation mechanisms of the photopolymerization initiator are roughly classified into two types: a cleavage type, in which radicals are generated by cleavage and decomposition of a covalent bond of the initiator per se; and a hydrogen-abstraction type, in which radicals are generated by abstracting and exciting hydrogen from a hydrogen donor in the system.

Any one of these may be used as the photopolymerization initiator (C), but the cleavage type is particularly preferable.

The cleavage type is decomposed and converted into another compound in radical generation by light irradiation, and, if once excited, it does not have a function as a reaction initiator. For this reason, when the cleavage type is used as the photopolymerization initiator (C) that reacts with light having a wavelength of 380 to 430 nm, as compared with the case of using the hydrogen-abstraction type, the photopolymerization initiator (C) is converted into a reaction decomposition product after the adhesive sheet is irradiated by light so that the absorbance in 380 to 430 nm region does not occur, thereby the irradiation light can easily reach the deep part of the adhesive sheet. Thus, it is preferable to use the cleavage type photopolymerization initiator as the photopolymerization initiator (C).

As the photopolymerization initiator (C), for instance, 2-benzyl-2-dimethylamino-1-(4-morpholinophenyl)butane-1-one, 2-(4-methylbenzyl)-2-dimethylamino-1-(4-morpholinophenyl)butane-1-one, bis(η5-2,4-cyclopentadiene-1-yl)-bis(2,6-difluoro-3-(1H-pyrrole-1-yl)phenyl)titanium, bis(2,4,6-trimethylbenzoyl)-phenylphosphine oxide, 2,4,6-trimethylbenzoyl diphenylphosphine oxide, thioxanthone, 2-chlorothioxanthone, 3-methylthioxanthone, 2,4-dimethylthioxanthone, 2-methylanthraquinone, 2-ethylanthraquinone, 2-tert-butyl-anthraquinone, 2-aminoanthraquinone, 1,2-octanedione, 1-(4-(phenylthio), 2-(o-benzoyloxime)), and the like, can be cited. These may be used singly, or as any derivative thereof, or in combinations of two or more.

Among them, as the cleavage type photopolymerization initiator, bis(2,4,6-trimethylbenzoyl)-phenylphosphine oxide and 2,4,6-trimethylbenzoyl diphenylphosphine oxide are preferable in terms of being converted into a decomposition product and color-faded after the reaction.

To adjust reactivity of the photopolymerization initiator (C), the photopolymerization initiator (C) can be used in combination with a sensitizer.

As the sensitizer, for instance, various amines and compounds such as anthraquinone and thioxanthone, can be cited. Among them, the amine series sensitizer is preferable since it has excellent solubility with respect to the adhesive composition and it does not inhibit UV light permeability.

(Wavelength Conversion Agent (D))

It is preferable that the wavelength conversion agent (D) is excited by light having a wavelength shorter than 380 nm and emits light having a wavelength of at least 380 to 550 nm.

The wavelength conversion agent (D) may be excited by light having a wavelength shorter than 380 nm, and among them, it is preferable to contain light having a wavelength shorter than 370 nm as an excitation region.

In addition, the wavelength conversion agent (D) may emit light having a wavelength of at least 380 to 550 nm, and among them, it is preferable to contain light having a wavelength of 390 to 500 nm as an emitting region.

From such viewpoints, as a preferred wavelength conversion agent (D), for instance, an oxazole series phosphor, a triazole series phosphor, a thiophene series phosphor, and the like, can be cited, and these can be used singly or in combinations of two or more.

It is preferable that the wavelength conversion agent (D) is a material compatible with the thermoplastic resin (A). If the wavelength conversion agent (D) is the material compatible with the thermoplastic resin (A), transparency thereof can be further enhanced.

From such viewpoint, it is preferable that the wavelength conversion agent (D) is an organic series phosphor.

(Concentration of Wavelength Conversion Agent (D))

If the concentration of the wavelength conversion agent (D) is too high, light for crosslinking may not reach the deep part of the adhesive sheet since it is blocked by the wavelength conversion agent (D). Meanwhile, when the thickness of the adhesive sheet is large, the light may also not reach the deep part of the adhesive sheet even if the concentration of the wavelength conversion agent (D) is low.

Thus, in the present adhesive sheet, it is preferable to adjust the concentration of the wavelength conversion agent (D), the thickness of the adhesive sheet, or the like such that the adhesive sheet absorbance X at a wavelength of 390 nm and the adhesive sheet thickness Y satisfy the following relational formula (1).

$$0.5 \leq X/Y \leq 12 \qquad \text{Formula (1):}$$

Among them, it is more preferable to adjust them to satisfy the formula (2).

$$0.7 \leq X/Y \leq 11 \qquad \text{Formula (2):}$$

Among them, it is furthermore preferable to adjust them to satisfy the formula (3).

$$0.9 \leq X/Y \leq 10 \qquad \text{Formula (3):}$$

In addition, from the same viewpoints as above, it is preferable to adjust the concentration of the wavelength conversion agent (D) such that a transmittance of the present adhesive sheet at a wavelength of 390 nm is in a range of 3 to 95%, among them 5% or more or 85% or less, and among them 7% or more or 80% or less.

<Adhesive Sheet with Release Film>

The present adhesive sheet may be an adhesive sheet with release film, which has a release film on one of the front and back sides or on both sides thereof.

Herein, for the release film used in the present adhesive sheet, a light transmittance of light having a wavelength shorter than 380 nm of at least one of the front and back sides of the release file is preferably 40% or less, more preferably 35% or less, and even more preferably 30% or less.

When the light transmittance of the light having a wavelength shorter than 380 nm of the release film is 40% or less, for instance in a storage state, a reaction initiation of the photopolymerization initiator (C) and an excitation of the wavelength conversion agent (D) can be suppressed, since the light for the reaction initiation can be blocked to some extent.

As the release files of which the light transmittance of the light having a wavelength shorter than 380 nm is 40% or less, for instance, a film containing a UV absorbing agent, a film of which a UV absorbing agent is applied or printed on the surface, a film on which a layer containing a UV absorbing agent is laminated, a release file made of paper, or the like, can be cited.

<Applications>

The present adhesive sheet can be suitably used to bond, for instance, the image display device constituent members which constitute image display devices. However, the application of the present adhesive sheet is not limited to these applications.

As such image display devices, for instance, personal computers, mobile terminals (PDAs), gaming machines, televisions (TVs), car navigation systems, touch panels, pen tablets, and the like, can be cited. However, they are not limited to these.

In addition, for instance, a touch panel, an image display panel, a surface protection panel, a phase difference film, a polarization film, and the like, can be cited as specific examples of the image display device constituent members, which may be any one of them or a laminate layered by two or more of them in advance. However, they are not limited to these.

<Present Adhesive Composition>

Adhesive compositions (I) and (II) will be described as preferred examples of the present adhesive composition. However, the present adhesive composition is not limited to the following adhesive compositions (I) and (II).

Incidentally, when the present adhesive sheet is to be made into a multilayered sheet, the present adhesive sheet is preferably formed using the adhesive composition, for instance the adhesive composition (I) or (II), since it is preferable that the outermost layer is provided with unevenness followability and anti-bubble reliability as in the case of the monolayer described above.

Meanwhile, it is preferable that the intermediate layer has light permeability to an extent that does not inhibit secondary curing reaction of outermost layer and has properties that elevate cuttability and handleability without losing transparency, since it does not contribute to the bonding of image display device constituent members.

The species of a base polymer forming the intermediate layer is not limited in particular if it is a transparent resin. The base polymer forming the intermediate layer may be the same resin as or a different resin from that of the outermost layers. Among them, from such points of view as securing transparency and ease of production, and further to prevent refraction of light at the layer interface, using an identical acrylic series resin to the base polymer of the outermost layer is preferable.

The intermediate layer and the other resin layer may have or may not have active energy ray curability. For instance, the intermediate layer may be formed so as to be cured by UV crosslinking, or may be formed so as to be cured by heat. Also, it may be formed so as not to be post-cured in particular. However, when tightness of contact with the outermost layer or the like is considered, it is preferable to form so as to be post-cured, and particularly preferable to form so as to be UV crosslinked. In so doing, since light transmittance decreases if the content in crosslinking initiator becomes large, it is preferable that the UV crosslinking agent is contained at a lower content percentage than the content percentage in the outer layer of the crosslinking initiator in the intermediate layer.

When the present adhesive sheet is to be made into a multilayered adhesive sheet, as a layered constitution, specifically, for instance, a two-layer by two-kind constitution on which the adhesive composition (I) or (II) and the other adhesive composition are laminated, a three-layer by two-kind constitution on which the adhesive composition (I) or (II) is disposed on the front and the back via the intermediate resin layer, a three-layer by three-kind constitution on which the adhesive composition (I) or (II), the intermediate resin composition, and the other adhesive composition are laminated in this order, or the like, can be cited.

<Adhesive Composition (I)>

As the adhesive composition (I), a resin composition containing an acrylic series copolymer (A1) which comprises a graft copolymer having a macromonomer as a branch component, a crosslinking agent (B1), a photopolymerization initiator (C1), and a wavelength conversion agent (D1), can be cited.

(Acrylic Series Copolymer (A1))

The acrylic series copolymer (A1) may be a graft copolymer having a macromonomer as a branch component.

(Stem Component)

It is preferable that a stem component of the acrylic series copolymer (A1) is constituted by a copolymer component containing a repeating unit derived from (meth)acrylic acid ester.

It is preferable that a glass transition temperature of the copolymer which constitutes the stem component of the acrylic series copolymer (A1) is −70 to 0° C.

Here, the glass transition temperature of the copolymer component which constitutes the stem component means a glass transition temperature of a polymer obtained by copolymerization of only a monomer component which composes the stem component of the acrylic series copolymer (A1). Specifically, [the glass transition temperature of the copolymer component which constitutes the stem component] means a value calculated from a glass transition temperature of a polymer obtained from a homopolymer of the each copolymer component and a constitution ratio thereof, by a FOX's calculation formula.

Incidentally, the FOX's calculation formula is a following formula, and [the glass transition temperature of the copolymer component which constitutes the stem component] is determined by using the value described in Polymer Handbook (J. Brandrup, Interscience, 1989).

$$1/(273+Tg)=\Sigma(Wi/(273+Tgi))$$

[where Wi represents a weight fraction of a monomer i, Tgi represents a Tg (° C.) of a homopolymer of the monomer i]

Since the glass transition temperature of the copolymer component which constitutes the stem component of the acrylic series copolymer (A1) influences flexibility of the adhesive composition (I) at room temperature and wettability of the adhesive composition (I) with respect to an adherend, that is, adhesiveness, the glass transition temperature is preferably −70 to 0° C., more preferably −65° C. or more or −5° C. or less, and particularly preferably −60° C. or more or −10° C. or less, in order for the adhesive composition (I) to obtain suitable adhesiveness (tackiness) at room temperature.

However, even when the glass transition temperature of the copolymer component is the same temperature, viscoelasticity can be adjusted by adjusting the molecular weight. For instance, it can be further softened by lowering molecular weight of the copolymer component.

As (meth)acrylic acid ester monomers which comprise the stem component of the acrylic series copolymer (A1), for instance, methyl (meth)acrylate, ethyl (meth)acrylate, propyl (meth)acrylate, isopropyl (meth)acrylate, n-butyl (meth)acrylate, isobutyl (meth)acrylate, sec-butyl (meth)acrylate, t-butyl (meth)acrylate, pentyl (meth)acrylate, isopentyl (meth)acrylate, neopentyl (meth)acrylate, hexyl (meth)acrylate, cyclohexyl (meth)acrylate, heptyl (meth)acrylate, 2-ethylhexyl (meth)acrylate, n-octyl (meth)acryte, isooctyl (meth)acrylate, nonyl (meth)acrylate, isononyl (meth)acrylate, t-butylcyclohexyl (meth)acrylate, decyl (meth)acrylate, isodecyl (meth)acrylate, undecyl (meth)acrylate, lauryl (meth)acrylate, cetyl (meth)acrylate, stearyl (meth)acrylate, isostearyl (meth)acrylate, behenyl (meth)acrylate, isobornyl (meth)acrylate, 2-phenoxyethyl (meth)acrylate, 3,5,5-trimethylcyclohexane acrylate, p-cumylphenol EO-modified (meth)acrylate, dicyclopentanyl (meth)acrylate, dicyclopentenyl (meth)acrylate, dicyclopentenyloxyethyl (meth)acrylate, benzyl (meth)acrylate, and the like, can be cited. In addition, hydroxyl group-containing (meth)acrylates having a hydrophilic group, an organic functional group, or the like, such as hydroxyethyl (meth)acrylate, hydroxypropyl (meth)acrylate, hydroxybutyl (meth)acrylate, and glycerol (meth)acrylate, carboxyl group-containing monomers such as (meth)acrylic acid, 2-(meth)acryloyloxyethylhexahydrophthalic acid, 2-(meth)acryloyloxypropylhexahydrophthalic acid, 2-(meth)acryloyloxyethylphthalic acid, 2-(meth)acryloyloxypropylphthalic acid, 2-(meth)acryloxyethylmaleic acid, 2-(meth)acryloyloxypropylmaleic acid, 2-(meth)acryloyloxyethylsuccinic acid, 2-(meth)acryloyloxypropylsuccinic acid, crotonic acid, fumaric acid, maleic acid, itaconic acid, monomethyl maleate, and monomethyl itaconate, acid anhydride group-containing monomers such as maleic anhydride and itaconic anhydride, epoxy group-containing monomers such as glycidyl (meth)acrylate, glycidyl α-ethylacrylate, and 3,4-epoxybutyl (meth)acrylate, amino group-containing (meth)acrylic acid ester series monomers such as dimethylaminoethyl (meth)acrylate and diethylaminoethyl (meth)acrylate, monomers containing amide groups such as (meth)acrylamide, N-t-butyl(meth)acrylamide, N-methylol(meth)acrylamide, N-methoxymethyl(meth)acrylamide, N-butoxymethyl(meth)acrylamide, diacetone(meth)acrylamide, maleic acid amide, and maleimide, heterocyclic basic monomers such as vinylpyrrolidone, vinylpyridine, and vinylcarbazole, and the like, can also be used.

Further, various vinyl monomers such as styrene, t-butylstyrene, α-methylstyrene, vinyltoluene, acrylonitrile, methacrylonitrile, vinyl acetate, vinyl propionate, alkyl vinyl ether, hydroxyalkyl vinyl ether, and alkyl vinyl monomer, which are copolymerizable with the acrylic monomers or the methacrylic monomers, can also be appropriately used.

Furthermore, it is preferable that the stem component of the acrylic series copolymer (A1) contains a hydrophobic (meth)acrylate monomer and a hydrophilic (meth)acrylate monomer as a constitutional unit.

When the stem component of the acrylic series copolymer (A1) is constituted solely by the hydrophobic monomer, a tendency to be a hygrothermal whitening is observed, therefore it is preferable to prevent the hygrothermal whitening by introducing the hydrophilic monomer to the stem component as well.

Specifically, as the stem component of the acrylic series copolymer (A1), a copolymer component obtained by the random copolymerization of the hydrophobic (meth)acrylate monomer, the hydrophilic (meth)acrylate monomer, and the polymerizable functional group of the terminal of the macromonomer, can be cited.

Herein, as the hydrophobic (meth)acrylate monomers above, for instance, n-butyl (meth)acrylate, isobutyl (meth)acrylate, sec-butyl (meth)acrylate, t-butyl (meth)acrylate, pentyl (meth)acrylate, isopentyl (meth)acrylate, neopentyl (meth)acrylate, hexyl (meth)acrylate, cyclohexyl (meth)acrylate, heptyl (meth)acrylate, 2-ethylhexyl (meth)acrylate, n-octyl (meth)acryte, isooctyl (meth)acrylate, nonyl (meth)acrylate, isononyl (meth)acrylate, t-butylcyclohexyl (meth)acrylate, decyl (meth)acrylate, isodecyl (meth)acrylate, undecyl (meth)acrylate, lauryl (meth)acrylate, cetyl (meth)acrylate, stearyl (meth)acrylate, isostearyl (meth)acrylate, behenyl (meth)acrylate, isobornyl (meth)acrylate, dicyclopentenyloxyethyl (meth)acrylate, and methyl methacrylate, can be cited. In addition, as the hydrophobic vinyl monomers, vinyl acetate, styrene, t-butylstyrene, α-methylstyrene, vinyltoluene, alkyl vinyl monomer, and the like, can be cited.

As the hydrophilic (meth)acrylate monomers above, for instance, methyl (meth)acrylate, (meth)acrylic acid, tetrahydrofurfuryl (meth)acrylate, hydroxyl group-containing (meth)acrylates such as hydroxyethyl (meth)acrylate, hydroxypropyl (meth)acrylate, hydroxybutyl (meth)acrylate, and glycerol (meth)acrylate, carboxyl group-containing monomers such as 2-(meth)acryloyloxyethylhexahydrophthalic acid, 2-(meth)acryloyloxypropylhexahydrophthalic acid, 2-(meth)acryloyloxyethylphthalic acid, 2-(meth)acryloyloxypropylphthalic acid, 2-(meth)acryloyloxyethylmaleic acid, 2-(meth)acryloyloxypropylmaleic acid, 2-(meth)acryloyloxyethylsuccinic acid, 2-(meth)acryloyloxypropylsuccinic acid, crotonic acid, fumaric acid, maleic acid, itaconic acid, monomethyl maleate, and monomethyl itaconate, acid anhydride group-containing monomers such as maleic anhydride and itaconic anhydride, epoxy group-containing monomers such as glycidyl (meth) acrylate, glycidyl α-ethyl (meth)acrylate, and 3,4-epoxybutyl (meth)acrylate, alkoxy polyalkylene glycol (meth)acrylate such as methoxy polyethylene glycol (meth)acrylate, N,N-dimethylacrylamide, hydroxyethyl acrylamide, and the like, can be cited.

(Branch Component: Macromonomer)

It is important that a macromonomer is introduced into the acrylic series copolymer (A1) as a branch component of the graft copolymer, and the acrylic series copolymer (A1) contains a repeating unit derived from the macromonomer.

The macromonomer is a high-molecular monomer having the polymerizable functional group of the terminal and the high-molecular weight skeleton component.

It is preferable that a glass transition temperature (Tg) of the macromonomer is higher than that of the copolymer component which constitutes the acrylic series copolymer (A1).

Specifically, since the glass transition temperature (Tg) of the macromonomer influences a heating and melting temperature (hot-melting temperature) of the adhesive composition (I), the glass transition temperature (Tg) of the macromonomer is preferably 30 to 120° C., more preferably 40° C. or more or 110° C. or less, and further preferably 50° C. or more or 100° C. or less.

With such glass transition temperature (Tg), excellent processability and storage stability can be retained by adjusting the molecular weight, and [the macromonomer] can be adjusted to hot-melt at near 80° C.

The glass transition temperature of macromonomer, which means a glass transition temperature of the macromonomer per se, can be measured by a differential scanning calorimeter (DSC).

In addition, it is also preferable to adjust the molecular weight and the content of the macromonomer, since a state as if [the macromonomer] is physically crosslinked, like an adhesive composition, by pulling the branch components together can be maintained at room temperature, and moreover, fluidity can be obtained by melting the physical crosslinking after being heated to the appropriate temperature.

From this point of view, the macromonomer is preferably contained in the acrylic series copolymer (A1) at a proportion of 5 to 30% by mass. More preferably, it is contained at a proportion of 6% by mass or more or 25% by mass or less, and even more preferably at a proportion of 8% by mass or more or 20% by mass or less.

Further, a number average molecular weight of the macromonomer is preferably 500 or more and less than 8,000, more preferably 800 or more and less than 7,500, and even more preferably 1,000 or more and less than 7,000.

As the macromonomer, those which are generally manufactured (for instance, a macromonomer manufactured by Toagosei Co., LTD., or the like) can be suitably used.

It is preferable that a high-molecular weight skeleton component of the macromonomer is constituted by an acrylic series polymer or a vinyl series polymer.

As the high-molecular weight skeleton component of the macromonomer, for instance, (meth)acrylate monomers such as methyl (meth)acrylate, ethyl (meth)acrylate, propyl (meth)acrylate, isopropyl (meth)acrylate, n-butyl (meth) acrylate, isobutyl (meth)acrylate, sec-butyl (meth)acrylate, t-butyl (meth)acrylate, pentyl (meth)acrylate, isopentyl (meth)acrylate, neopentyl (meth)acrylate, hexyl (meth)acrylate, cyclohexyl (meth)acrylate, heptyl (meth)acrylate, 2-ethylhexyl (meth)acrylate, n-octyl (meth)acryte, isooctyl (meth)acrylate, nonyl (meth)acrylate, isononyl (meth)acrylate, t-butylcyclohexyl (meth)acrylate, decyl (meth)acrylate, isodecyl (meth)acrylate, undecyl (meth)acrylate, lauryl (meth)acrylate, cetyl (meth)acrylate, stearyl (meth)acrylate, isostearyl (meth)acrylate, behenyl (meth)acrylate, isobornyl (meth)acrylate, 2-phenoxyethyl (meth)acrylate, 3,5,5-trimethylcyclohexane (meth)acrylate, p-cumylphenol EO-modified (meth)acrylate, dicyclopentanyl (meth)acrylate, dicyclopentenyl (meth)acrylate, dicyclopentenyloxyethyl (meth) acrylate, benzyl (meth)acrylate, hydroxyalkyl (meth) acrylate, (meth)acrylic acid, glycidyl (meth)acrylate, (meth) acrylamide, N,N-dimethyl (meth)acrylamide, (meth) acrylonitrile, alkoxy alkyl (meth)acrylate, and alkoxy polyalkylene glycol (meth)acrylate, various vinyl monomers such as styrene, t-butylstyrene, α-methylstyrene, vinyltoluene, alkyl vinyl monomer, vinyl acetate, alkyl vinyl ether, and hydroxyalkyl vinyl ether, can be cited, and these can be used singly or in combinations of two or more.

As the terminal polymerizable functional group of the macromonomer, for instance, methacryloyl group, acryloyl group, vinyl group, and the like, can be cited.

(Physical Properties of Acrylic Series Copolymer (A1))

A complex viscosity of the acrylic series copolymer (A1) at a temperature of 130° C. and a frequency of 0.02 Hz is preferably 100 to 800 Pa·s, more preferably 150 to 700 Pa·s, and further preferably 170 to 600 Pa·s.

Since the complex viscosity of the acrylic series copolymer (A1) at the temperature of 130° C. influences fluidity of the adhesive composition (I) when the transparent double-sided adhesive material is used by hot-melting, if such complex viscosity is in the range of 100 to 800 Pa·s, excellent hot-melting suitability can be provided.

In order to adjust the complex viscosity of the acrylic series copolymer (A1) to be in the range described above, for instance, a method for adjusting a weight average molecular weight of the acrylic series copolymer (A1) or the glass transition temperature of the copolymer component which constitutes the stem component of the acrylic series copolymer (A1), can be cited.

The weight average molecular weight of the acrylic series copolymer (A1) is preferably 50,000 to 500,000, more preferably 120,000 or more or 450,000 or less, and even more preferably 150,000 or more or 400,000 or less.

In addition, for the glass transition temperature of the copolymer component which constitutes the stem component of the acrylic series copolymer (A1), the adjustment method of viscoelasticity by adjusting the glass transition temperature so as to be preferably in a range of −70 to 0° C., more preferably −65° C. or more or −5° C. or less, and even more preferably −60° C. or more or −10° C. or less, and by adjusting the molecular weight of the copolymer component, can be cited. However, the adjustment method is not limited to these methods.

(Crosslinking agent (B1))

As the crosslinking agent (B1), for instance, a crosslinking agent comprising an epoxy crosslinking agent, an isocyanate crosslinking agent, an oxetane compound, a silane compound, an acrylic compound, or the like, can be appropriately selected. Above all, from the viewpoint of reactivity and the strength of the obtained cured product, a polyfunctional (meth)acrylate having two or more (meth)acryloyl groups is preferable. Among them, a polyfunctional (meth)acrylate having three or more (meth)acryloyl groups is more preferable.

By crosslinking the crosslinking agent (B1) in the adhesive material after the image display device constituent members are bonded into a single body, the sheet loses hot-melting properties, and instead of that, high cohesive force can be exerted under high temperature environment, and excellent antifoaming reliability can be obtained.

As such polyfunctional (meth)acrylate, for instance, in addition to UV-curable polyfunctional monomers such as 1,4-butanediol di(meth)acrylate, neopentyl glycol di(meth)acrylate, glycerin di(meth)acrylate, glyceringlycidyl ether di(meth)acrylate, 1,6-hexanediol di(meth)acrylate, 1,9-nonanediol di(meth)acrylate, tricyclodecanedimethanol di(meth)acrylate, bisphenol A polyethoxy di(meth)acrylate, bisphenol A polyalkoxy di(meth)acrylate, bisphenol F polyalkoxy di(meth)acrylate, polyalkylene glycol di(meth)acrylate, trimethylolpropane trioxyethyl (meth)acrylate, ε-caprolactone-modified tris(2-hydroxyethyl)isocyanurate tri(meth)acrylate, pentaerythritol tri(meth)acrylate, alkoxylated pentaerythritol tri(meth)acrylate, pentaerythritol tetra(meth)acrylate, alkoxylated pentaerythritol tetra(meth)acrylate, dipentaerythritol hexa(meth)acrylate, alkoxylated dipentaerythritol hexa(meth)acrylate, tris(acryloxyethyl)isocyanurate, dipentaerythritol penta(meth)acrylate, alkoxylated dipentaerythritol penta(meth)acrylate, tripentaerythritol hexa(meth)acrylate, tripentaerythritol penta(meth)acrylate, hydroxy pivalic acid neopentyl glycol di(meth)acrylate, di(meth)acrylate of ε-caprolactone adduct of hydroxy pivalic acid neopentyl glycol, trimethylolpropane tri(meth)acrylate, alkoxylated trimethylolpropane tri(meth)acrylate, and ditrimethylolpropane tetra(meth)acrylate; polyifunctional acrylic oligomers such as polyester (meth)acrylate, epoxy (meth)acrylate, urethane (meth)acrylate and polyether (meth)acrylate; can be cited.

Among the above, from the viewpoints of improving tightness of contact with respect to the adherend and the effect of suppressing hygrothermal whitening, a polyfunctional monomer or an oligomer containing a polar functional group such as a hydroxyl group is preferable.

Among them, it is more preferable to use a polyfunctional (meth)acrylic acid ester having a hydroxyl group.

Accordingly, from the viewpoint of preventing the hygrothermal whitening, it is preferable to contain the hydrophobic acrylate monomer and the hydrophilic acrylate monomer as stem component of the acrylic series copolymer (A1), that is, the graft copolymer, and furthermore, it is preferable to use the polyfunctional (meth)acrylic acid ester having the hydroxyl group as the crosslinking agent (B).

The content of the crosslinking agent (B1) is not limited in particular. As a guide, the content is preferably at a proportion of 0.5 to 20 parts by mass, more preferably 1 part by mass or more or 15 parts by mass or less, and even more preferably 2 parts by mass or more or 10 parts by mass or less, with respect to 100 parts by mass of the acrylic series copolymer (A1).

By containing the crosslinking agent (B1) at the above range, both the shape stability of the present adhesive sheet in an uncrosslinked state and the antifoaming reliability of the adhesive material in a crosslinked state can be obtained. However, the ratio may be out of such ranges depending on the balance with other elements.

(Photopolymerization Initiator (C1))

As the photopolymerization initiator (C1), those which fulfill a function as a reaction initiating aid in a crosslinking reaction of the aforementioned crosslinking agent (B1), and those which are described according to the aforementioned photopolymerization initiator (C), can be suitably used.

The content of the photopolymerization initiator (C1) is not limited in particular. As a guide, the content is preferably at a proportion of 0.1 to 10 parts by mass, more preferably 0.5 part by mass or more or 5 parts by mass or less, and even more preferably 1 part by mass or more or 3 parts by mass or less, with respect to 100 parts by mass of the acrylic series copolymer (A1).

By having the content of the photopolymerization initiator (C1) in the range described above, appropriate reaction sensitivity with respect to the active energy ray can be obtained.

(Wavelength Conversion Agent (D1))

As the wavelength conversion agent (D1), those which fulfill a function to promote a photocuring reaction at the place where are difficult for light to reach such as a print-concealed section, and those which are described according to the aforementioned wavelength conversion agent (D), can be suitably used.

The content of the wavelength conversion agent (D1) is not particularly limited, but it is preferably at a proportion of 0.001 to 2 parts by mass, more preferably 0.002 part by mass or more or 1.5 parts by mass or less, and even more preferably 0.004 part by mass or more or 1 part by mass or less, with respect to 100 parts by mass of the acrylic series copolymer (A1).

(Other Components)

The adhesive composition (I) may contain known components which are blended into an ordinary adhesive composition, as a component other than the above ones. For instance, various kinds of additives such as a tackifying resin, an antioxidant, a light stabilizer, a UV absorbing agent, a metal deactivator, a rust preventive, an antiaging agent, a moisture absorbent, a foaming agent, a defoaming agent, inorganic particles, and a viscosity modifier can be appropriately contained, if necessary.

In addition, a reaction catalyst (a tertiary amine series compound, a quaternary ammonium series compound, a tin laurate compound, or the like) may be appropriately contained, if necessary.

<Adhesive Composition (II)>

As the adhesive composition (II), a resin composition, which is formed by copolymerization of a monomer (a) having a glass transition temperature (Tg) of less than 0° C., a monomer (b) having a glass transition temperature (Tg) of 0° C. or more and less than 80° C., and a monomer (c) having a glass transition temperature (Tg) of 80° C. or more in a mole ratio of (a):(b):(c)=10 to 40:90 to 35:0 to 25, containing a base polymer (A2) which comprises a (meth)acrylic acid ester copolymer or a vinyl copolymer having a weight average molecular weight of 50,000 to 400,000, a crosslinking agent (B2), a photopolymerization initiator (C2), and a wavelength conversion agent (D2) can be cited.

Here, the base polymer means a resin which is contained in the adhesive composition (II) as a main component. Although the specific content is not defined, as a guide, the content proportion of the resin is 50% by mass or more, particularly 80% by mass or more, and among them, 90% by mass or more (including 100% by mass) with respect to resins contained in the adhesive composition (II) (when two or more base polymers are present, sum of these contents corresponds to the content mentioned above).

(Base Polymer (A2))

The base polymer (A2) is preferably a (meth)acrylic acid ester copolymer or a vinyl copolymer.

From the viewpoint of achieving both the shape stability at room temperature and the hot-melting properties, a weight average molecular weight of the (meth)acrylic acid ester copolymer or the vinyl copolymer is preferably 50,000 to 400,000, more preferably 60,000 or more or 350,000 or less, and more preferably 70,000 or more or 300,000 or less.

In the acrylic acid ester series copolymer, the physical properties such as the glass transition temperature (Tg) and the molecular weight can be appropriately adjusted by selecting the species, composition ratio, furthermore, the polymerization conditions, and the like, of the acrylic monomer or the methacrylic monomer used to adjust this.

At this time, as acrylic monomers constituting the acrylic acid ester copolymer, for instance, 2-ethylhexyl acrylate, n-octylacryte, isooctyl acrylate, n-butyl acrylate, ethyl acrylate, and the like can be cited as the main raw materials.

Aside from these, a (meth)acrylic monomer having various functional groups may be copolymerized with the acrylic monomer, according to such purposes as conferring cohesive force, conferring polarity, and the like.

As the (meth)acrylic monomer having functional groups, for instance, methyl methacrylate, methyl acrylate, hydroxyethyl acrylate, acrylic acid, glycidyl acrylate, N-substituted acrylamide, acrylonitrile, methacrylonitrile, fluorine-containing alkyl acrylate, organo-siloxy group-containing acrylate, and the like, can be cited.

Meanwhile, as the vinyl copolymer, a vinyl copolymer, which is suitably formed by polymerization of various vinyl monomers, such as vinyl acetate which is copolymerizable with the acrylic monomers and the methacrylic monomers above, alkylvinyl ether, and hydroxy alkylvinyl ether, can be cited.

It is preferable that the base polymer (A2) of the present adhesive sheet is a (meth)acrylic acid ester copolymer or a vinyl copolymer which is formed by copolymerization of a monomer (a) having a glass transition temperature of less than 0° C., a monomer (b) having a glass transition temperature of 0° C. or more and less than 80° C., and a monomer (c) having a glass transition temperature of 80° C. or more in a mole ratio of (a):(b):(c)=10 to 40:90 to 35:0 to 25.

Here, each of the glass transition temperature (Tg) of the monomers (a), (b) and (c) means a glass transition temperature (Tg) when a polymer is produced from the monomer (homopolymerized).

The monomer (a) is preferably a (meth)acrylic acid ester monomer having an alkyl group structure which has, for instance, a side chain of 4 or more carbon numbers.

In so doing, the side chain of 4 or more carbon numbers may comprise a straight chain or a branched carbon chain.

More specifically, the monomer (a) is preferably a (meth)acrylic acid ester monomer having a straight chain alkyl group structure of 4 to 10 carbon numbers, or a (meth)acrylic acid ester monomer having a branched alkyl group structure of 6 to 18 carbon numbers.

Herein, as the "(meth)acrylic acid ester monomer having a straight chain alkyl group structure of 4 to 10 carbon numbers", n-butyl (meth)acrylate, n-hexyl (meth)acrylate, n-octyl (meth)acrylate, n-nonyl (meth)acrylate, n-decyl (meth)acrylate, and the like, can be cited.

Meanwhile, as the "(meth)acrylic acid ester monomer having a branched chain alkyl group structure of 6 to 18 carbon numbers", 2-ethylhexyl (meth)acrylate, 2-methylhexyl (meth)acrylate, isooctyl (meth)acrylate, isononyl (meth)acrylate, isodecyl (meth)acrylate, isostearyl (meth)acrylate, and the like, can be cited.

The monomer (b) is preferably a (meth)acrylic acid ester monomer of 4 or less carbon numbers, a (meth)acrylic acid ester monomer having a cyclic skeleton in the side chain, a vinyl monomer of 4 or less carbon numbers, or a vinyl monomer having a cyclic skeleton in the side chain.

Among them, the monomer (b) is more preferably a vinyl monomer in which the carbon number of the side chain is 4 or less.

Herein, as the "(meth)acrylic acid ester monomer of 4 or less carbon numbers", methyl (meth)acrylate, ethyl (meth)acrylate, n-propyl (meth)acrylate, isopropyl (meth)acrylate, n-butyl (meth)acrylate, t-butyl (meth)acrylate, isobutyl (meth)acrylate, and the like, can be cited.

As the "(meth)acrylic acid ester monomer having a cyclic skeleton in the side chain", isobornyl (meth)acrylate, cyclohexyl (meth)acrylate, 1,4-cyclohexanedimethanol mono (meth)acrylate, tetrahydrofurfuryl (meth)acrylate, benzyl (meth)acrylate, phenoxyethyl (meth)acrylate, 2-hydroxy-3-phenoxypropyl (meth)acrylate, 3,3,5-trimethyl cyclohexanol (meth)acrylate, cyclic trimethylolpropane formal (meth)acrylate, ethoxylated 4-cumyl phenol (meth)acrylate, dicyclopentenyloxyethyl (meth)acrylate, dicyclopentenyl (meth)acrylate, and the like, can be cited.

As the "vinyl monomer of 4 or less carbon numbers", vinyl acetate, vinyl propionate, vinyl butylate, n-propyl vinyl ether, isopropyl vinyl ether, n-butyl vinyl ether, isobutyl vinyl ether, and the like, can be cited.

As the "vinyl monomer having a cyclic skeleton in the side chain", styrene, cyclohexyl vinyl ether, norbornyl vinyl ether, norbornenyl vinyl ether, and the like, can be cited. Among them, the vinyl monomer in which the carbon number of the side chain is 4 or less, or the acrylic acid ester monomer in which the carbon number of the side chain is 4 or less, is particularly suitable.

The monomer (c) is preferably a (meth)acrylic acid ester monomer in which the carbon number of the side chain is 1 or less, or a (meth)acrylic acid ester monomer having a cyclic skeleton in the side chain.

Herein, as the "(meth)acrylic acid ester monomer in which the carbon number of the side chain is 1 or less", methyl methacrylate, acrylic acid, methacrylic acid, and the like, can be cited.

As the "(meth)acrylic acid ester monomer having a cyclic skeleton in the side chain", isobornyl methacrylate, 3,3,5-trimethyl cyclohexanol methacrylate, dicyclopentanyl acrylate, dicyclopentanyl methacrylate, dicyclopentenyl methacrylate, and the like, can be cited.

When the base polymer (A2) contains the (meth)acrylic acid ester copolymer or a vinyl copolymer which is formed by copolymerization of the monomer (a), the monomer (b), and the monomer (c) in a mole ratio of (a):(b):(c)=10 to 40:90 to 35:0 to 25, a peak of Tan δ can be adjusted to 0 to 20° C., and a sheet shape can be maintained at normal temperature, that is, at room temperature. Moreover, adhesiveness with a peelable degree (referred to as "tackiness") can be exerted. Also, when [the base polymer (A2)] is heated at a hot-meltable temperature, fluidity thereof can be exerted so that [the base polymer (A2)] can be filled to every corner by following a step of the bonding surface.

Thus, from such viewpoints, the mole ratio of the monomer (a), the monomer (b), and the monomer (c) in the (meth)acrylic acid ester copolymer or the vinyl copolymer which constitutes the base polymer (A2) is preferably a:b: c=10 to 40:90 to 35:0 to 25, more preferably 13 to 40:87 to 35:0 to 23, and even more preferably 15 to 40:85 to 38:2 to 20.

Further, from the same viewpoints as above, the mole ratio of the monomer (a), the monomer (b), and the monomer (c) in the (meth)acrylic acid ester copolymer or the vinyl copolymer which constitutes the base polymer (A2) is preferably b>a>c.

(Crosslinking Agent (B2))

By crosslinking the crosslinking agent (B2) in the present adhesive sheet, the present adhesive sheet can exert high cohesive force under high temperature environment, and can obtain excellent antifoaming reliability.

As such crosslinking agent (B2), for instance, a crosslinking agent comprising an epoxy crosslinking agent, an isocyanate crosslinking agent, an oxetane compound, a silane compound, an acrylic compound, or the like, can be appropriately selected. Among them, from the viewpoint of reactivity and the strength of the obtained cured product, a polyfunctional (meth)acrylate having two or more (meth) acryloyl groups is preferable. In particular, a polyfunctional (meth)acrylate having three or more (meth)acryloyl groups is more preferable.

As such polyfunctional (meth)acrylate, for instance, in addition to UV-curable polyfunctional monomers such as 1,4-butanediol di(meth)acrylate, neopentyl glycol di(meth) acrylate, glycerin di(meth)acrylate, glyceringlycidyl ether di(meth)acrylate, 1,6-hexanediol di(meth)acrylate, 1,9-nonanediol di(meth)acrylate, tricyclodecanedimethanol di(meth)acrylate, bisphenol A polyethoxy di(meth)acrylate, bisphenol A polyalkoxy di(meth)acrylate, bisphenol F polyalkoxy di(meth)acrylate, polyalkylene glycol di(meth)acrylate, trimethylolpropane trioxyethyl (meth)acrylate, ε-caprolactone-modified tris(2-hydroxyethyl)isocyanurate tri(meth) acrylate, pentaerythritol tri(meth)acrylate, alkoxylated pentaerythritol tri(meth)acrylate, pentaerythritol tetra(meth) acrylate, alkoxylated pentaerythritol tetra(meth)acrylate, dipentaerythritol hexa(meth)acrylate, alkoxylated dipentaerythritol hexa(meth)acrylate, tris(acryloxyethyl)isocyanurate, dipentaerythritol penta(meth)acrylate, alkoxylated dipentaerythritol penta(meth)acrylate, tripentaerythritol hexa(meth)acrylate, tripentaerythritol penta(meth)acrylate, hydroxy pivalic acid neopentyl glycol di(meth)acrylate, di(meth)acrylate of ε-caprolactone adduct of hydroxy pivalic acid neopentyl glycol, trimethylolpropane tri(meth) acrylate, alkoxylated trimethylolpropane tri(meth)acrylate, and ditrimethylolpropane tetra(meth)acrylate; polyifunctional acrylic oligomers such as polyester (meth)acrylate, epoxy (meth)acrylate, urethane (meth)acrylate and polyether (meth)acrylate; can be cited.

Among the above, from the viewpoints of improving tightness of contact with respect to the adherend, heat resistance, and the effect of suppressing hygrothermal whitening, a polyfunctional monomer or an oligomer containing a polar functional group is preferable. Among them, it is more preferable to use a polyfunctional (meth)acrylic acid ester having an isocyanuric ring skeleton.

The content of the crosslinking agent (B2) is not limited in particular. As a guide, the content is preferably at a proportion of 0.5 to 20 parts by mass, more preferably 1 part by mass or more or 15 parts by mass or less, and even more preferably 2 parts by mass or more or 10 parts by mass or less, with respect to 100 parts by mass of the base polymer (A2).

By containing the crosslinking agent (B2) at the above range, both the shape stability of the present adhesive sheet in an uncrosslinked state and the antifoaming reliability of the adhesive sheet in a crosslinked state can be obtained. The ratio, however, may be out of such ranges depending on the balance with other element.

<Photopolymerization Initiator (C2)>

As the photopolymerization initiator (C2), those which fulfill a function as a reaction initiating aid in a crosslinking reaction of the aforementioned crosslinking agent (B2), and those which are described according to the aforementioned photopolymerization initiator (C), can be suitably used.

The content of the photopolymerization initiator (C2) is not limited in particular. As a guide, the content is preferably at a proportion of 0.1 to 10 parts by mass, more preferably 0.5 part by mass or more or 5 parts by mass or less, and even more preferably 1 part by mass or more or 3 parts by mass or less, with respect to 100 parts by mass of the base polymer (A2).

By having the content of the photopolymerization initiator (C2) in the range described above, appropriate reaction sensitivity with respect to the active energy ray can be obtained.

(Wavelength Conversion Agent (D2))

As the wavelength conversion agent (D2), those which fulfill a function to promote a photocuring reaction at the place where are difficult for light to reach such as a print-concealed section, and those which are described according to the aforementioned wavelength conversion agent (D), can be suitably used.

The content of the wavelength conversion agent (D2) is not particularly limited, but it is preferably at a proportion of 0.001 to 2 parts by mass, more preferably 0.002 part by mass or more or 1.5 parts by mass or less, and even more preferably 0.004 part by mass or more or 1 part by mass or less, with respect to 100 parts by mass of the base polymer (A2).

(Other Components)

The adhesive composition (II) may contain known components which are blended into an ordinary adhesive composition, as a component other than the above ones. For instance, various kinds of additives such as a tackifying resin, an antioxidant, a light stabilizer, a UV absorbing agent, a metal deactivator, a rust preventive, an antiaging agent, a moisture absorbent, a foaming agent, a defoaming agent, inorganic particles, and a viscosity modifier can be appropriately contained, if necessary.

In addition, a reaction catalyst (a tertiary amine series compound, a quaternary ammonium series compound, a tin laurate compound, or the like) may be appropriately contained as needed.

<Explanation of Terms>

As used herein, the expression "X to Y" (X and Y are any numbers) also encompasses the meaning "preferably larger than X" or "preferably smaller than Y" together with the meaning "X or more and Y or less" unless otherwise noted.

In addition, the expression "X or more" (X is any number) or "Y or less" (Y is any number) also encompasses the intention of "preferably larger than X" or "preferably less than Y."

In general, "sheet" refers to a thin, flat product generally having a relatively small thickness as compared with length and width in accordance with the definition in Japanese Industrial Standards (JIS). On the other hand, "film" refers to a thin, flat product having a relatively very small thickness as compared with length and width and a maximum thickness that is arbitrarily limited and is usually supplied in the form of a roll (Japan Industrial Standards JISK6900). For example, in connection to the thickness, in a narrow sense, a product having a thickness of 100 μm or more is referred to as a sheet, while a product having a thickness of less than 100 μm is referred to as a film. The boundary between the sheet and the film, however, is uncertain, and it is not necessary to literally distinguish both the sheet and the film in the present invention. Therefore, in the present invention, even when the "film" is mentioned, the "sheet" is encompassed, and even when the "sheet" is mentioned, the "film" is encompassed.

EXAMPLES

Hereinafter, the invention will be described in more detail with reference to Examples and Comparative Examples. However, the present invention is not limited to these.

Example 1

By using an acrylic acid ester copolymer (A-1) (weight average molecular weight: 230,000) which is formed by random copolymerization of 15 parts by weight of polymethyl methacrylate macromonomer that has 2,400 of number average molecular weight, 81 parts by weight of butyl acrylate, and 4 parts by weight of acrylic acid as the acrylic series copolymer (A), an adhesive resin composition 1 was produced by uniformly mixing 90 g of glycerin dimethacrylate (B-1) as the crosslinking agent (B), 15 g of ESACURE KTO46 (manufactured by Lamberti S.p.A.)(C-1) as the photopolymerization initiator (C), and 0.1 g of 2,5-bis(5-t-butyl-2-benzoxazolyl)thiophene (Tinopal OB, manufactured by BASF)(D-1) as the wavelength conversion agent (D), with respect to 1 kg of the acrylic acid ester copolymer (A-1).

The adhesive resin composition 1 was sandwiched with two release films in which one was a release-treated polyethylene terephthalate film (referred to as "release film 1", DIAFOIL MRV-V06, manufactured by Mitsubishi Plastics, Inc., thickness of 100 μm) and another one was a release-treated polyethylene terephthalate film (referred to as "release film 2", DIAFOIL MRQ, manufactured by Mitsubishi Plastics, Inc., thickness of 75 μm), and was shaped into a sheet using a laminator so as to have a thickness of 200 μm, thereby producing an adhesive sheet 1.

Herein, the 2,5-bis(5-t-butyl-2-benzoxazolyl)thiophene (D-1) as the wavelength conversion agent (D) is an organic phosphor, and has a property which is compatible with the acrylic acid ester copolymer (A-1). The acrylic acid ester copolymer (A-1) is a type of (meth)acrylic acid ester copolymer which comprises a graft copolymer having a macromonomer as a branch component. The adhesive resin composition 1 has a hot-melting property of being softened or flowed by heating in an uncrosslinked state, and photo-crosslinkability of being crosslinked by light.

Example 2

An adhesive resin composition 2 was produced in the same manner as in Example 1 except that the mixing amount of the 2,5-bis(5-t-butyl-2-benzoxazolyl)thiophene (Tinopal OB, manufactured by BASF)(D-1) as the wavelength conversion agent (D) was changed to 0.5 g.

Then, in the same manner as in Example 1, the adhesive resin composition 2 was sandwiched with the release films 1 and 2, and was shaped into a sheet using a laminator so as to have a thickness of 150 μm, thereby producing an adhesive sheet 2.

Example 3

An adhesive resin composition 3 was produced in the same manner as in Example 1 except that the mixing amount of the 2,5-bis(5-t-butyl-2-benzoxazolyl)thiophene (Tinopal OB, manufactured by BASF)(D-1) as the wavelength conversion agent (D) was changed to 1 g.

Then, in the same manner as in Example 1, the adhesive resin composition 3 was sandwiched with the release films 1 and 2, and was shaped into a sheet using a laminator so as to have a thickness of 125 μm, thereby producing an adhesive sheet 3.

Example 4

An adhesive resin composition 4 was produced by uniformly mixing 100 g of trimethylolpropane epoxy acrylate (B-2) as the crosslinking agent (B), 30 g of ESACURE KTO46 (manufactured by Lamberti S.p.A.)(C-1) as the photopolymerization initiator (C), and 0.2 g of 2,5-bis(5-t-butyl-2-benzoxazolyl)thiophene (D-1) as the wavelength conversion agent (D), with respect to 1 kg of the acrylic acid ester copolymer (A-1) which was used in Example 1.

Then, in the same manner as in Example 1, the adhesive resin composition 4 was sandwiched with the release films 1 and 2, and was shaped into a sheet using a laminator so as to have a thickness of 150 μm, thereby producing an adhesive sheet 4.

Herein, the adhesive resin composition 4 has a hot-melting property of being softened or flowed by heating in an uncrosslinked state, and photo-crosslinkability of being crosslinked by light.

Example 5

An adhesive resin composition 5 was produced in the same manner as in Example 4 except that 15 g of ESACURE TZT (manufactured by Lamberti S.p.A.)(C-2) as the photopolymerization initiator (C) was mixed instead of mixing 30 g of ESACURE KTO46 (C-1) in Example 4, and 50 g of ESACURE A198 (manufactured by Lamberti S.p.A.) as a photosensitizer was mixed.

Then, in the same manner as in Example 1, the adhesive resin composition 5 was sandwiched with the release films 1 and 2, and was shaped into a sheet using a laminator so as to have a thickness of 150 μm, thereby producing an adhesive sheet 5.

Example 6

An adhesive resin composition 6 was produced in the same manner as in Example 1 except that 1 g of Hakkol PY1800 (manufactured by Showa Kagaku Kogyo Co., LTD.) (D-2) as the wavelength conversion agent (D) was mixed instead of mixing 0.1 g of the wavelength conversion agent (D-1) in Example 1.

Then, in the same manner as in Example 1, the adhesive resin composition 6 was sandwiched with the release films 1 and 2, and was shaped into a sheet using a laminator so as to have a thickness of 150 μm, thereby producing an adhesive sheet 6.

Herein, the Hakkol PY1800 as the wavelength conversion agent (D) is an organic phosphor, and has a property which is compatible with the acrylic acid ester copolymer (A-1).

The adhesive resin composition 6 has a hot-melting property of being softened or flowed by heating in an uncrosslinked state, and photo-crosslinkability of being crosslinked by light.

Example 7

An adhesive resin composition 7 was produced in the same manner as in Example 1 except that 1 g of Hakkol PSR (manufactured by Showa Kagaku Kogyo Co., LTD.) (D-3) as the wavelength conversion agent (D) was mixed instead of mixing 0.1 g of the wavelength conversion agent (D-1) in Example 1.

Then, in the same manner as in Example 1, the adhesive resin composition 7 was sandwiched with the release films 1 and 2, and was shaped into a sheet using a laminator so as to have a thickness of 150 μm, thereby producing an adhesive sheet 7.

Herein, the Hakkol PSR as the wavelength conversion agent (D) is an organic phosphor, and has a property which is compatible with the acrylic acid ester copolymer (A-1).

The adhesive resin composition 7 has a hot-melting property of being softened or flowed by heating in an uncrosslinked state, and photo-crosslinkability of being crosslinked by light.

Example 8

By using a vinyl series copolymer (A-2)(weight average molecular weight: 170,000) which is formed by random copolymerization of 55 parts by weight of 2-ethylhexyl acrylate, 40 parts by weight of vinyl acetate, and 5 parts by weight of acrylic acid as the vinyl series copolymer (A), an adhesive resin composition 8 was produced by uniformly mixing 75 g of (2,4,6-trioxo-1,3,5-triazine-1,3,5-triyl) triethylene triacrylate (B-3) (ARONIX M315, manufactured by Toagosei Co., LTD.) as the crosslinking agent (B), 15 g of ESACURE KT046 (C-1) (manufactured by Lamberti S.p.A.) as the photopolymerization initiator (C), and 0.2 g of 2,5-bis(5-t-butyl-2-benzoxazolyl)thiophene (Tinopal OB, manufactured by BASF)(D-1) as the wavelength conversion agent (D), with respect to 1 kg of the vinyl series copolymer (A-2).

Then, in the same manner as in Example 1, the adhesive resin composition 8 was sandwiched with the release films 1 and 2, and was shaped into a sheet using a laminator so as to have a thickness of 150 μm, thereby producing an adhesive sheet 8.

Herein, the 2,5-bis(5-t-butyl-2-benzoxazolyl)thiophene (D-1) as the wavelength conversion agent (D) is an organic phosphor, and has a property which is compatible with the vinyl series copolymer (A-2). The vinyl series copolymer (A-2) is a type of vinyl series copolymer which is formed by copolymerization of a monomer (a) having a glass transition temperature (Tg) of less than 0° C., a monomer (b) having a glass transition temperature (Tg) of 0° C. or more and less than 80° C., and a monomer (c) having a glass transition temperature (Tg) of 80° C. or more in a mole ratio of (a):(b):(a)=10 to 40:90 to 35:0 to 25.

The adhesive resin composition 8 has a hot-melting property of being softened or flowed by heating in an uncrosslinked state, and photo-crosslinkability of being crosslinked by light.

Example 9

An adhesive sheet 9 was produced in the same manner as in Example 2 except that a release-treated polyethylene terephthalate film ("DIAFOIL O700E-100", manufactured by Mitsubishi Plastics, Inc., thickness of 100 μm) on which a UV absorbing agent was applied (referred to as "release film 3") was used instead of the release film 1.

Comparative Example 1

An adhesive resin composition 10 was produced in the same manner as in Example 1 except that the 2,5-bis(5-t-butyl-2-benzoxazolyl)thiophene (Tinopal OB, manufactured by BASF)(D-1) as the wavelength conversion agent (D) was not added.

Then, in the same manner as in Example 1, the adhesive resin composition 10 was sandwiched with the release films 1 and 2, and was shaped into a sheet using a laminator so as to have a thickness of 150 μm, thereby producing an adhesive sheet 10.

Comparative Example 2

An adhesive resin composition 11 was produced by uniformly mixing 90 g of trimethylolpropane epoxy acrylate (B-2) as the crosslinking agent (B), 15 g of ESACURE KT046 (manufactured by Lamberti S.p.A.) (C-1) as the photopolymerization initiator (C), and 2 g of 2,5-bis(5-t-butyl-2-benzoxazolyl)thiophene (D-1) as the wavelength conversion agent (D), with respect to 1 kg of the acrylic acid ester copolymer (A-1) which was used in Example 1. Then, in the same manner as in Example 1, the adhesive resin composition 11 was sandwiched with the release films 1 and 2, and was shaped into a sheet using a laminator so as to have a thickness of 150 μm, thereby producing an adhesive sheet 11.

Comparative Example 3

An adhesive resin composition 12 was produced according to Example 3 of Japanese Patent No. 4971529.

In other words, 50 g of nonanediol diacrylate (V #260, manufactured by Osaka Organic Chemical Industry LTD.) (B-4) as the crosslinking agent (B) and 10 g of 4-methylbenzophenone (C-3) as the photopolymerization initiator (C) was mixed and added into 1 kg of the acrylic acid ester copolymer (A-3) which is formed by random copolymerization of 75 parts by mass of 2-ethylhexyl acrylate, 20 parts by mass of vinyl acetate, and 5 parts by mass of acrylic acid, thereby preparing an adhesive resin composition 12.

Then, in the same manner as in Example 1, the adhesive resin composition 12 was sandwiched with the release films 1 and 2, and was shaped into a sheet using a laminator so as to have a thickness of 150 μm.

Subsequently, an adhesive layer thereof was irradiated by UV light via a polyethylene terephthalate film such that the UV light at 365 nm wavelength reached 1,000 mJ/cm$^2$ to crosslink a part of the crosslinking agent, thereby producing an adhesive sheet 12 (thickness of 150 μm).

Comparative Example 4

As the comparative example of a liquid adhesive resin composition, an adhesive resin composition 13 was produced by preparing a mixture of 410 g of isobornyl methacrylate (IB-X, manufactured by Kyoeisha Chemical Co., LTD.) and 130 g of tetrahydrofurfuryl acrylate (SR285, manufactured by ARKEMA) with respect to 460 g of polyisobutylene diacrylate oligomer (CN310, manufactured by ARKEMA), and further by adding 540 g of liquid polybutadiene (RYCON134, manufactured by Cray Valley) as a plasticizer, 17 g of diphenyl-2,4,6-trimethylbenzoyl phosphine oxide (C-2)(Omnirad TPO, manufactured by IGM) and 33 g of 1-hydroxy-cyclohexyl phenyl ketone (C-3)(IRGACURE 184, manufactured by BASF) as the photopolymerization initiator (C), and 0.16 g of 2,5-bis(5-t-butyl-2-benzoxazolyl)thiophene (D-1) as the wavelength conversion agent (D). Incidentally, this composition could not be shaped into a sheet since it was in a liquid state.

[Evaluation]

For the samples obtained in the Examples and the Comparative Examples, each item was evaluated by the following methods.

(Gel Fraction)

A double-sided tape was bonded on one side of a black sheet (LSL-8, manufactured by Inoac Corp., light transmittance: 0%), and was cut to have a size of 50 mm×20 mm, thereby producing a light-shielding sheet.

For the adhesive sheets produced in the Examples 1 to 8 and the Comparative Examples 1 to 3, the light-shielding sheet was bonded on the surface of one side of the release film 2, thereby producing a laminate in which one part thereof was concealed. However, for the adhesive composition 13 of the Comparative Example 4, the adhesive composition 13 was sandwiched with the release film 2 with concealed place, which was produced by bonding the light-shielding sheet on the release film 2, and the release film 1 so as to have a thickness of 150 μm.

Next, the adhesive composition was cured by irradiating UV light from the light-shielding sheet side of the laminate produced as above using a high-pressure mercury lamp such that the integrated amount of light at a wavelength of 365 nm reached 2,000 mJ/cm².

As to the places where the light was shielded, a place from the edge at the long side to 1 mm was cut by a cutter, and a gel fraction of the object which was only the adhesive composition taken therefrom was measured using the following method. Also, for the adhesive composition prior to curing and the adhesive composition at the exposed place, a gel fraction was determined in the same procedure.

<Measurement Method for Gel Fraction>

1) The adhesive composition is weighted ($W_1$), and is wrapped in an SUS mesh which is weighed in advance ($W_0$).

2) The SUS mesh is immersed in 100 ml of ethyl acetate for 24 hours.

3) The SUS mesh is taken out, and is dried at 75° C. for 4.5 hours.

4) A weight after drying ($W_2$) is determined, and a gel fraction of the adhesive composition is measured by the following formula.

Gel fraction (%)=100×($W_2-W_0$)/$W_1$ (Bonding Force)

For the adhesive sheets produced in the Examples 1 to 8 and the Comparative Examples 1 to 3, one side of the release film 2 was peeled off, and then a PET film (DIAFOIL T 100, manufactured by Mitsubishi Plastics, Inc., thickness of 50 μm) having a thickness of 50 μm as a backing film was bonded thereon.

The above laminate article was cut into a size of 150 mm-length×10 mm-width, and then the adhesive surface exposed by peeling off the remaining release film 1 was applied to a soda lime glass by roll compression.

The bonded article obtained as above was subjected to an autoclaving treatment (for 30 minutes at 80° C. and a gauge pressure of 0.2 MPa) for finish-adhesion. Thereafter this was irradiated from the backing PET film side by UV light such that the integrated amount of light at 365 nm reached 2,000 mJ/cm² to cure the adhesive sheet, and then this was aged for 15 hours at 23° C. and 50% RH to serve as a sample for peel force measurement.

The adhesive composition 13 of the Example 4 was applied on a soda lime glass so as to be a thickness of 150 μm, and then a PET film (DIAFOIL T 100, manufactured by Mitsubishi Plastics, Inc., thickness of 50 μm) having a thickness of 50 μm as a backing film was bonded thereon.

This was irradiated from the backing PET film side by UV light such that the integrated amount of light at 365 nm reached 2,000 mJ/cm² to cure the adhesive sheet, and then the cured product was cut into a strip shape of 10 mm-width by a cutter to serve as a sample for peel force measurement.

The peeling force (N/cm) with respect to the glass when the sample for peel force measurement was peeled off at a peel angle of 1800 and a peel rate of 60 mm/min under the environment of 23° C. and 40% RH was measured.

(Step Followability)

A 5 mm-wide, 40 μm-thick print (total light transmittance: 0%) was applied at the periphery of a 60 mm×90 mm×thickness of 0.5 mm soda lime glass to produce a glass substrate for evaluation having an 40 μm printed step at the periphery. This glass substrate for evaluation is a substitute for an image display device constitutive member having a concealed section with a stepped part on the bonding surface.

The adhesive sheet was bonded to the printed surface of the glass substrate by peeling off of one side of the release film 2 of the adhesive sheets produced in the Examples 1 to 8 and the Comparative Examples 1 to 3, and by reciprocating a roller of 1 kg two times so as to cover the printed step at the periphery. Next, the remaining release film 1 was peeled off, and a cyclo olefin polymer film (thickness of 100 μm) was press-bonded to the exposed adhesive surface thereof with a pressing pressure of 0.02 MPa under reduced pressure (absolute pressure: 5 kPa), then an autoclave treatment (for 20 minutes at 60° C. and 0.2 MPa) was performed for finish-adhesion.

For the adhesive composition 13 of the Comparative Example 4, the adhesive composition 12 was directly applied on a glass substrate so as to be a thickness of 150 μm, and then this was covered with a cyclo olefin polymer film (thickness of 100 μm). The laminate was irradiated from the glass substrate side by UV light using a high-pressure mercury lamp such that the integrated amount of light at a wavelength of 365 nm reached 2,000 mJ/cm².

The produced laminates were visually observed. Those in which unevenness due to the fact that the film bent and strained in the vicinity of the step was observed were judged as "X", and those which had no bubbles and were smoothly bonded were judged as "◯".

(Storage Stability)

For the laminates produced in the step followability evaluation, the adhesive composition at the printed place was visually observed.

It was also visually observed after heating in an oven at 85° C. for 6 hours, and then, those in which the adhesive composition just under the printed place was flowed and protruded before the heating test were judged as "X", those in which the adhesive composition was flowed after heating and aging were judged as "Δ", and those in which a crushing or a protrusion of the adhesive was not observed through the heating test were judged as "◯".

(Total Light Transmittance and Haze)

For the laminates produced in the step followability evaluation, the total light transmittance and the haze value were measured according to JIS K7361-1 and JIS K7136 using a haze meter (NDH5000, manufactured by Nippon Denshoku Industries Co., LTD.), respectively.

(Spectral Transmittance and Absorbance)

For the laminates produced in the step followability evaluation, the spectral transmittance (T %) for a wavelength of 300 to 500 nm was measured using a spectrophotometer (UV2000, manufactured by Shimadzu Corp.). The absorbance X was calculated from the transmittance at a wavelength of 390 nm by the following formula, and the absorbance X was divided by the adhesive sheet thickness Y (mm) to solve for X/Y.

$X=-\text{Log}(T/100)$

TABLE 1

|  |  | Example 1 | Example 2 | Example 3 | Example 4 | Example 5 | Example 6 | Example 7 |
|---|---|---|---|---|---|---|---|---|
| Main component (A) | (A-1) | 100 | 100 | 100 | 100 | 100 | 100 | 100 |
|  | (A-2) |  |  |  |  |  |  |  |
|  | (A-3) |  |  |  |  |  |  |  |
| Crosslinking agent (B) | (B-1) | 9 | 9 | 9 |  |  | 9 | 9 |
|  | (B-2) |  |  |  | 10 | 10 |  |  |
|  | (B-3) |  |  |  |  |  |  |  |
|  | (B-4) |  |  |  |  |  |  |  |
| Photopolymerization initiator (C) | (C-1) | 1.5 | 1.5 | 1.5 | 3 |  | 1.5 | 1.5 |
|  | (C-2) |  |  |  |  | 1.5 |  |  |
|  | (C-3) |  |  |  |  |  |  |  |
| Wavelength conversion agent (D) | (D-1) | 0.01 | 0.05 | 0.1 | 0.02 | 0.02 |  |  |
|  | (D-2) |  |  |  |  |  | 0.1 |  |
|  | (D-3) |  |  |  |  |  |  | 0.1 |
|  | Sensitizer |  |  |  |  | 0.5 |  |  |
|  | Other |  |  |  |  |  |  |  |
| Gel fraction (%) | Before curing | <1% | <1% | <1% | <1% | <1% | <1% | <1% |
|  | Exposed place | 66% | 67% | 72% | 39% | 49% | 72% | 72% |
|  | Concealed place | 37% | 48% | 55% | 20% | 4% | 59% | 51% |
| Adhesive sheet thickness Y (μm) |  | 200 | 150 | 125 | 150 | 150 | 150 | 150 |
| 390 nm absorbance X |  | 0.14 | 0.56 | 0.87 | 0.27 | 0.25 | 0.40 | 0.17 |
| X/Y |  | 0.7 | 3.7 | 7.0 | 1.8 | 1.7 | 2.7 | 1.1 |
| 390 nm spectral transmittance (%) |  | 73% | 28% | 13% | 54% | 56% | 40% | 68% |
| Bonding force (N/cm) |  | 6 | 6 | 6 | 9 | 7 | 5 | 6 |
| Total light transmittance (%) |  | 91 | 91 | 91 | 91 | 91 | 91 | 91 |
| Haze (%) |  | 0.3 | 0.3 | 0.3 | 0.3 | 0.3 | 0.3 | 0.3 |
| Step followability |  | ○ | ○ | ○ | ○ | ○ | ○ | ○ |
| Storage stability |  | ○ | ○ | ○ | ○ | ○ | ○ | ○ |
| Overall evaluation |  | ○ | ○ | ○ | ○ | ○ | ○ | ○ |

|  |  | Example 8 | Comparative Example 1 | Comparative Example 2 | Comparative Example 3 | Comparative Example 4 |
|---|---|---|---|---|---|---|
| Main component (A) | (A-1) |  | 100 | 100 |  |  |
|  | (A-2) | 100 |  |  |  |  |
|  | (A-3) |  |  |  | 100 |  |
| Crosslinking agent (B) | (B-1) |  | 9 |  |  |  |
|  | (B-2) |  |  | 9 |  |  |
|  | (B-3) | 7.5 |  |  |  |  |
|  | (B-4) |  |  |  |  | 5 |
| Photopolymerization initiator (C) | (C-1) |  |  | 1.5 |  |  |
|  | (C-2) |  | 1.5 |  | 1 |  |
|  | (C-3) | 1 |  |  |  |  |
| Wavelength conversion agent (D) | (D-1) | 0.15 |  | 0.2 |  |  |
|  | (D-2) |  |  |  |  |  |
|  | (D-3) |  |  |  |  |  |
|  | Sensitizer |  |  |  |  |  |
|  | Other |  |  |  |  | 100 |
| Gel fraction (%) | Before curing | <1% | <1% | <1% | 57% | <1% |
|  | Exposed place | 67% | 67% | 3% | 74% | 90% |
|  | Concealed place | 22% | <1% | <1% | 56% | 45% |
| Adhesive sheet thickness Y (μm) |  | 150 | 150 | 150 | 150 | 150 |
| 390 nm absorbance X |  | 1.57 | 0.06 | 2.09 | 0.061 | 0.100 |
| X/Y |  | 10.4 | 0.4 | 13.9 | 0.3 | 0.7 |
| 390 nm spectral transmittance (%) |  | 3% | 88% | 1% | 89% | 79% |
| Bonding force (N/cm) |  | 10 | 6 | 9 | 10 | 0.5 |
| Total light transmittance (%) |  | 91 | 91 | 91 | 91 | 91 |
| Haze (%) |  | 0.3 | 0.2 | 0.3 | 0.2 | 0.2 |
| Step followability |  | ○ | ○ | ○ | X | ○ |
| Storage stability |  | ○ | Δ | X | ○ | X |
| Overall evaluation |  | ○ | Δ | X | X | X |

(Spectral Transmittance of Release Film)

For the release films 1 and 3 which were used at the time of production in Examples 2 and 9, the spectral transmittance (T %) for a wavelength of 300 to 500 nm was measured using the spectrophotometer (UV2000, manufactured by Shimadzu Corp.).

In addition, the adhesive sheets 2 and 9 produced in Examples 2 and 9, on which the release film 1 of the adhesive sheet 2 was placed upward and the release film 3 of the adhesive sheet 9 was placed upward, were flatly placed and storaged under a fluorescent light (environmental illuminance: 1,170 lux) for one day. Thereafter, each of the gel fractions of the adhesive sheets 2 and 9 after one day storage was calculated according to the measurement method for gel fraction as described above. The measurement results are described in Table 2.

TABLE 2

|  |  | Example 2 | Example 9 |
|---|---|---|---|
| Release film spectral transmittance | 360 nm | 87% | 0% |
|  | 380 nm | 89% | 1% |
|  | 400 nm | 90% | 85% |
| Gel fraction | After fluorescent light exposure | 46% | 2% |

[Considerations]

It was found that the adhesive compositions of Examples had excellent step followability and the wavelength conversion agent contributed to promote the curing at the concealed place as the result of having high fluidity when bonding, thereby the curing under the print was proceeded and the storage stability was excellent.

Meanwhile, in Comparative Example 1, as the wavelength conversion agent was not contained, the adhesive composition at the printed step place was partly flowed, thereby resulting in insufficient storage stability at high temperature.

In Comparative Example 2, as the absorbance by the wavelength conversion agent was high, the light which was necessary for photo-crosslinking did not reach the deep part of the polymer composition, thereby it was resulted that the photocuring reaction was not proceeded sufficiently even at the place where were exposed directly.

In Comparative Example 3, although the wavelength conversion agent was not contained, since the primary crosslinking was performed on the member before bonding, excellent storage stability was obtained. However, the film was bent in vicinity of the step when bonding, thereby step absorbability was not obtained sufficiently.

In Comparative Example 4, the adhesive composition had excellent step absorbability since it was the liquid adhesive composition and was arbitrarily flowed. However, a protrusion of the resin was observed at the place, such as under the print, that was difficult for the adhesive composition to cure, thereby the storage stability was insufficient. Also, the cured product did not have tackiness since the acrylic series copolymer was not contained, thereby the bonding force to the adherend was inferior. Incidentally, for the gel fraction value at the concealed place in Comparative Example 4, since a part of the adhesive was remained as in a liquid state, all the resin composition could not be collected from the adherend, thereby the accurate gel fraction value could not be obtained.

Further, it was found from the result in Example 9 that the proceeding of gelation in the adhesive sheet before use could be suppressed by having a constitution comprising the release film of which the light transmittance of the light having a wavelength shorter than 380 nm is 40% or less.

The invention claimed is:

1. A transparent adhesive sheet, comprising an adhesive composition comprising:
   (A) a thermoplastic resin;
   (B) a crosslinking agent;
   (C) a photopolymerization initiator that reacts with light having a wavelength of at least 380 to 430 nm; and
   (D) a wavelength conversion agent that is excited by light having a wavelength shorter than 380 nm and that emits light having a wavelength of 380 to 550 nm,
   wherein an absorbance X of the transparent adhesive sheet at a wavelength of 390 nm and a thickness Y (mm) of the transparent adhesive sheet satisfy the following relational formula (1):

$$0.5 \leq X/Y \leq 12, \quad \text{Formula (1):}$$

provided that:

$$X = -\text{Log}(T/100),$$

where T is a transmittance (%) for a wavelength of 390 nm, and
   the thermoplastic resin (A) is an acrylic series copolymer which comprises a graft copolymer having a macromonomer as a branch component.

2. The transparent adhesive sheet according to claim 1, wherein the wavelength conversion agent (D) is a material compatible with the thermoplastic resin (A).

3. The transparent adhesive sheet according to claim 1, having a hot-melting property of being softened or flowed by heating in an uncrosslinked state, and photo-crosslinkability of being crosslinked by light.

4. A transparent adhesive sheet, comprising an adhesive composition comprising:
   (A) a thermoplastic resin;
   (B) a crosslinking agent;
   (C) a photopolymerization initiator that reacts with light having a wavelength of at least 380 to 430 nm; and
   (D) a wavelength conversion agent that is excited by light having a wavelength shorter than 380 nm and that emits light having a wavelength of 380 to 550 nm,
   wherein an absorbance X of the transparent adhesive sheet at a wavelength of 390 nm and a thickness Y (mm) of the transparent adhesive sheet satisfy the following relational formula (1):

$$0.5 \leq X/Y \leq 12, \quad \text{Formula (1):}$$

provided that:

$$X = -\text{Log}(T/100),$$

where T is a transmittance (%) for a wavelength of 390 nm,
   the thermoplastic resin (A) is formed by copolymerization of a monomer a having a glass transition temperature (Tg) of less than 0° C., a monomer b having a glass transition temperature (Tg) of 0° C. or more and less than 80° C., and a monomer c having a glass transition temperature (Tg) of 80° C. or more in a mole ratio of a:b:c=10 to 40:90 to 35:0 to 25, and
   the thermoplastic resin (A) is a resin containing a (meth) acrylic acid ester copolymer or a vinyl copolymer having a weight average molecular weight of 50,000 to 400,000.

5. A transparent adhesive sheet, comprising an adhesive composition comprising:
   (A) a thermoplastic resin;
   (B) a crosslinking agent;

(C) a photopolymerization initiator that reacts with light having a wavelength of at least 380 to 430 nm; and
(D) a wavelength conversion agent that is excited by light having a wavelength shorter than 380 nm and that emits light having a wavelength of 380 to 550 nm,
wherein an absorbance X of the transparent adhesive sheet at a wavelength of 390 nm and a thickness Y (mm) of the transparent adhesive sheet satisfy the following relational formula (1):

$$0.5 \leq X/Y \leq 12, \quad \text{Formula (1)}:$$

provided that:

$$X = -\text{Log}\,(T/100),$$

where T is a transmittance (%) for a wavelength of 390 nm, and
the adhesive sheet has a release film on one of the front and back sides or on both sides, and at least the release film on one of the front and back sides is a film having a light transmittance of 40% or less of the light having a wavelength shorter than 380 nm.

6. The transparent adhesive sheet according to claim 4, wherein the wavelength conversion agent (D) is a material compatible with the thermoplastic resin (A).

7. The transparent adhesive sheet according to claim 4, having a hot-melting property of being softened or flowed by heating in an uncrosslinked state, and photo-crosslinkability of being crosslinked by light.

8. The transparent adhesive sheet according to claim 5, wherein the wavelength conversion agent (D) is a material compatible with the thermoplastic resin (A).

9. The transparent adhesive sheet according to claim 5, having a hot-melting property of being softened or flowed by heating in an uncrosslinked state, and photo-crosslinkability of being crosslinked by light.

10. The transparent adhesive sheet according to claim 5, wherein the thermoplastic resin (A) is an acrylic series copolymer which comprises a graft copolymer having a macromonomer as a branch component.

11. The transparent adhesive sheet according to claim 5, wherein the thermoplastic resin (A) is formed by copolymerization of a monomer a having a glass transition temperature (Tg) of less than 0° C., a monomer b having a glass transition temperature (Tg) of 0° C. or more and less than 80° C., and a monomer c having a glass transition temperature (Tg) of 80° C. or more in a mole ratio of a:b:c=10 to 40:90 to 35:0 to 25, and
the thermoplastic resin (A) is a resin containing a (meth) acrylic acid ester copolymer or a vinyl copolymer having a weight average molecular weight of 50,000 to 400,000.

* * * * *